(12) United States Patent
Thoma

(10) Patent No.: US 9,130,571 B2
(45) Date of Patent: Sep. 8, 2015

(54) INITIALIZING A CAPACITIVE SENSING SWITCH FOR A WIRELESS DEVICE

(75) Inventor: Jeffrey M. Thoma, San Diego, CA (US)

(73) Assignee: Kyocera Corporation, Kyoto (JP)

(*) Notice: Subject to any disclaimer, the term of this patent is extended or adjusted under 35 U.S.C. 154(b) by 2012 days.

(21) Appl. No.: 11/776,467

(22) Filed: Jul. 11, 2007

(65) Prior Publication Data

US 2009/0014309 A1    Jan. 15, 2009

(51) Int. Cl.
*H03M 11/00* (2006.01)
*H03K 17/96* (2006.01)

(52) U.S. Cl.
CPC .. *H03K 17/9622* (2013.01); *H03K 2217/94089* (2013.01)

(58) Field of Classification Search
CPC .................................................. H03K 17/9622
USPC ............................ 341/20, 22, 23, 33; 713/300
See application file for complete search history.

(56) References Cited

U.S. PATENT DOCUMENTS

| | | | | |
|---|---|---|---|---|
| 3,693,059 A * | 9/1972 | Harris | | 200/600 |
| 4,274,093 A * | 6/1981 | Judge | | 345/174 |
| 4,379,287 A * | 4/1983 | Tyler et al. | | 341/33 |
| 4,557,694 A * | 12/1985 | Nelson | | 434/339 |
| 4,728,931 A * | 3/1988 | Linder et al. | | 341/25 |
| 4,920,343 A * | 4/1990 | Schwartz | | 341/33 |
| 5,063,306 A * | 11/1991 | Edwards | | 327/77 |
| 6,724,366 B2 * | 4/2004 | Crawford | | 345/157 |
| 8,022,935 B2 * | 9/2011 | Hotelling | | 345/173 |
| 8,266,575 B1 * | 9/2012 | Ogami et al. | | 716/138 |
| 8,717,302 B1 * | 5/2014 | Qin et al. | | 345/173 |
| 8,872,771 B2 * | 10/2014 | Hotelling et al. | | 345/168 |
| 2004/0008129 A1 * | 1/2004 | Philipp | | 341/22 |
| 2004/0019810 A1 * | 1/2004 | Casebolt et al. | | 713/300 |

FOREIGN PATENT DOCUMENTS

WO    WO 95/25385    9/1995

OTHER PUBLICATIONS

Vallis, Darrin, "Cypress Application Note AN2355—Calibrating CapSense with the CSR User Module" (Feb. 22, 2006) At http://www.cypress.com/design/AN2355 (accessed Feb. 9, 2007).
Tsui, Ted, "Cypress Application Note AN2393—Migrating from CSR to CSA" (Oct. 10, 2006) at http://www.cypress.com/design/AN2393 (accessed Feb. 9, 2007).

* cited by examiner

*Primary Examiner* — Amine Benlagsir

(57) ABSTRACT

An apparatus, system, and method that initialize a capacitive sensing switch and detects a pushed button are described. The apparatus comprises a keypad, a logic component, an initialization threshold, a measured capacitive value, and a processor. The keypad comprises at least one capacitive sensing switch. The logic component is configured to determine a capacitive sensing range for each capacitive sensing switch, wherein the range corresponds to the difference between the maximum and minimum capacitance. Each capacitive sensing switch is initialized when the capacitive sensing range exceeds the initialization threshold. The measured capacitive value measures the capacitive value for each switch and a corresponding push-button threshold determines whether the button has been pushed. The processor is configured to process computer instructions that correspond to each switch when the capacitive sensing range exceeds the initialization threshold and when the measured capacitive value for each capacitive sensing switch exceeds the push-button threshold.

14 Claims, 4 Drawing Sheets

INITIALIZING A CAPACITIVE SENSING SWITCH FOR A WIRELESS DEVICE

FIELD OF THE INVENTION

This invention relates to initializing a capacitive sensing switch that is disposed on a wireless device. More particularly, the invention relates to initializing a capacitive sensing switch that is associated with a keypad for the wireless device and detecting a pushed button.

BACKGROUND

Capacitive sensors can directly sense electrical fields. Additionally, capacitive sensors can indirectly sense other variables such as pressure associated with a button push. Capacitive sensors are composed of conductive sensing electrodes, a dielectric, and detection circuits that detect changes in capacitance. There are a variety of applications for capacitive sensors including using capacitive sensors as keys or buttons on the keypad of a wireless device.

Like traditional mechanical switches, the effectiveness of a capacitive sensor is dependent on the sensor sensitivity under a variety of different operating conditions. The sensitivity of a capacitive sensor is determined by the physical design, the method used to measure the capacitance and the determination of the capacitive change.

Capacitive sensors may be designed on affordable printed circuit boards (PCBs) such as a standard PCB or printed flex circuits using the same copper material that is used for signal routing. Typically, the sensitivity of the sensor is determined by the physical size of the sensor and a combination of the plastic overlay dielectric constant, including the dissipation factor, and thickness of the overlay material.

Referring to FIG. 1 there is shown an illustrative capacitive sensor or switch that can be used to detect a button being pushed. The capacitive sensor 10 acts as a keyboard button and consists of a first conductive element 12 that is adjacent a second conductive element 14 and separated by a dielectric 16. Generally, there is a small edge-to-edge capacitance associated with dielectric 16.

With respect to button sensitivity, there must be enough sensitivity to detect a button push while avoiding excessive sensitivity that results in false positives due to electromagnetic interference (EMI). Since wireless devices communicate using electromagnetic waves and continuously adjust signal strength, the wireless device generates variable EMI that interferes with the capacitive sensing switch.

Referring to FIG. 2 there is shown the capacitive switch being pushed by a user. When the illustrative finger 20 is placed on the plates 12 and 14 there is an additional capacitance 22 and 24 that increases the overall capacitance and the result is an increase in the RC rise time during the charging cycle. This change in capacitance determines that a button has been pushed.

To detect that a button has been pushed, the change in capacitance is measured. One method for measuring capacitance is applying a constant-current source continuously to charge the capacitive sensor to a reference threshold level on a comparator. The comparator will pulse high each time the capacitive sensor reaches the reference threshold level; this closes the switch and discharges the capacitor and resets the counter. To determine whether a user is in contact with the capacitive sensor the quantity of clock cycles that correspond with the capacitive sensor being charged up to the reference level on the comparator are measured. The number of clock cycles may then be compared with a preset threshold detection setting to determine whether a button has been pushed. An alternative method for measuring capacitance may employ an analog-to-digital converter.

In operation, the illustrative button 10 works on the principle that when a finger 20 is applied to the button, the capacitance increases and lengthens the RC time constant that results in a baseline minimum RC time constant and a "finger present" maximum RC time constant.

With respect to wireless devices, there are various limitations to relying exclusively on the minimum RC time constant and "finger present" maximum RC time constant. One of these limitations is caused by the variable EMI associated with the wireless communications. As the EMI increases and decreases, there is no change to the baseline minimum RC time constant, and there is no change to the "finger present" maximum RC time constant. Additionally, making the capacitive switch button more sensitive does not resolve the variable EMI concerns, because increased sensitivity results in false positives. Thus, there is a need to effectively initialize a capacitive sensing switch on a wireless device.

SUMMARY

An apparatus that initializes a capacitive sensing switch disposed on a wireless device and detects a pushed button is described. The apparatus comprises a keypad, a logic component, an initialization threshold, a measured capacitive value, and a processor. The keypad is disposed on the wireless device and comprises at least one capacitive sensing switch. The logic component is configured to determine a capacitive sensing range for each capacitive sensing switch, wherein the capacitive sensing range corresponds to the difference between the maximum capacitance and the minimum capacitance. The initialization threshold is associated with the capacitive sensing range and each capacitive sensing switch is initialized when the capacitive sensing range exceeds the initialization threshold. The measured capacitive value measures the capacitive value for each capacitive sensing switch and a corresponding push-button threshold determines whether the button has been pushed. The processor is configured to process computer instructions that correspond to each capacitive sensing switch when the capacitive sensing range exceeds the initialization threshold and when the measured capacitive value for each capacitive sensing switch exceeds the push-button threshold.

A system for initializing the capacitive sensing switch on a wireless device and detecting a pushed button is described. The system comprises a keypad, a means for determining a capacitive sensing range, an initialization threshold, a measured capacitive value, and a means for detecting a button press. The means for determining a capacitive sensing range for each capacitive sensing switch corresponds to the difference between the maximum capacitance and the minimum capacitance. The initialization threshold is associated with the capacitive sensing range, and each capacitive sensing switch is initialized when the capacitive sensing range exceeds the initialization threshold. The measured capacitive value measures the capacitive value for each capacitive sensing switch and a corresponding push-button threshold determines whether the capacitive sensing switch has been pushed. The means for detecting a button press occurs when the measured capacitive value exceeds the push-button threshold.

A method for initializing a capacitive sensing switch on a wireless device and detecting a pushed button is described. The method comprises determining a capacitive sensing range for at least one capacitive sensing switch, wherein the capacitive range corresponds to the charging and discharging of the capacitive sensing switch. The method then establishes a first condition that comprises determining whether the capacitive sensing range exceeds a first initialization threshold and initializes the capacitive sensing switch. The method also comprises establishing a second condition that repeatedly measures a capacitive value for the capacitive sensing switch and determines whether the measured capacitive value exceeds a second push-button threshold. A button press for the capacitive sensing switch is detected when the first condition and second condition have been satisfied.

DRAWINGS

The present invention will be more fully understood by reference to the following drawings which are for illustrative, not limiting, purposes.

DETAILED DESCRIPTION

Persons of ordinary skill in the art will realize that the following description is illustrative and not in any way limiting. Other embodiments of the claimed subject matter will readily suggest themselves to skilled persons having the benefit of this disclosure. It shall be appreciated by those of ordinary skill in the art that the apparatus and devices described hereinafter may vary as to configuration and as to details. Additionally, the methods may vary as to details, order of the actions, or other variations without departing from the illustrative method disclosed herein.

An apparatus, system and method that initialize a capacitive sensing switch on a wireless device are described. By effectively initializing the capacitive sensing switch the previously described limitations are overcome. In general, there are two conditions that must be satisfied to detect a button push with the capacitive sensing switch. The first condition determines whether a capacitive range for the capacitive switch exceeds an initialization threshold. By requiring sufficient separation in the capacitive range, the sensitivity of the capacitive switch is dependent on the difference between two measurements and minimizes the signal-to-noise concerns. Additionally, a second condition is presented that corresponds to measuring a capacitive value having the measured capacitive value exceed a second push-button threshold. The push-button threshold is associated with push button detection. Thus, if both conditions are satisfied a pressed button is detected.

The illustrative embodiment comprises a software process that includes computer instructions residing in a logic component, a processor, a memory, or any combination thereof. Additionally, the illustrative embodiments comprise at least one capacitive sensing switch that is integrated with a wireless device.

Figure 3:
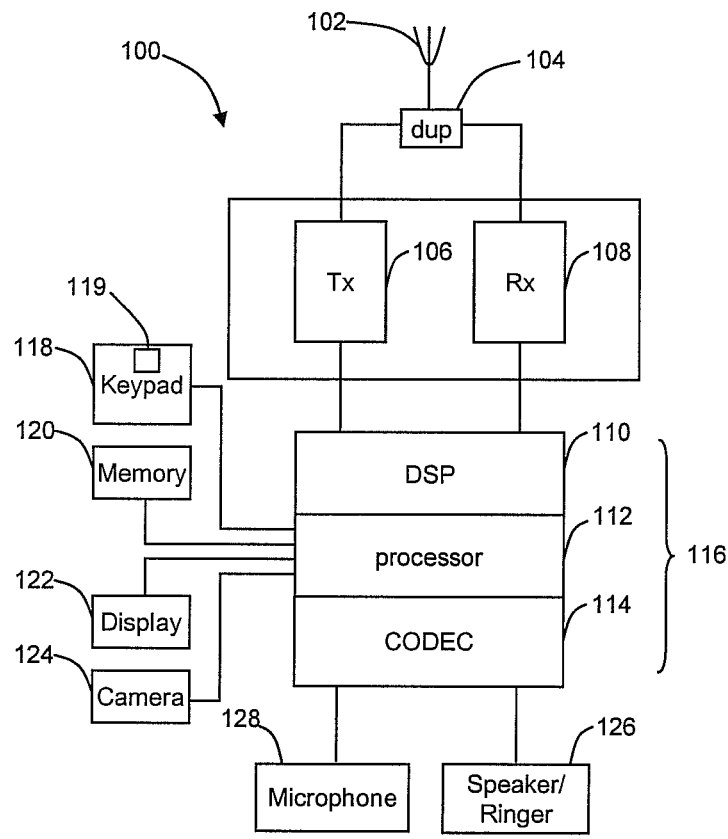
FIG. 3 shows an illustrative wireless device that is configured to communicate using a plurality of different wireless communication standards.

Referring to FIG. 3 there is shown an illustrative wireless device that is configured to communicate using a plurality of different wireless communication standards. The illustrative wireless device is a multimode wireless handset 100 that is configured to communicate using a plurality of different communication standards including Personal Area Network (PAN) communications standards and wide area communication standards. The illustrative multimode wireless handset 100 comprises a first antenna element 102 that is operatively coupled to a duplexer or diplexer 104 that is operatively coupled to a multimode transmitter module 106 and a multimode receiver module 108. The illustrative multimode transmitter module 106 and multimode receiver module 108 each comprise a plurality of transmitter modules and receiver modules that communicate using separate communication technologies such as Bluetooth and CDMA.

An illustrative control module 116 comprises a digital signal processor (DSP) 110, a processor 112, and a CODEC 114 that are communicatively coupled to the transmitter module 106 and receiver module 108. The DSP 110 may be configured to perform a variety of operations such as controlling the antenna 102, the multimode transmitter module 106 and the multimode receiver module 108. The processor 112 is operatively coupled to a keypad 118, a memory 120, a display 122, and a camera 124. Additionally, the processor 112 is also operatively coupled to the CODEC module 114 that performs the encoding and decoding operations and is communicatively coupled to a speaker or ringer 126 and a microphone 128.

The illustrative wireless handset 100 may be built as a light weight and small device adapted to be portable and may be conveniently carried around by a user. The wireless handset 100 is further adapted for caller operation and is enabled to permit a user to manually input data with the keypad 118. The keypad 118 may be a normal key pad, such as key pad for a cell phone or a PDA, and may additionally include specific input keys, such as a scrolling means or the like, to input particular information or to perform particular selection functions.

Figure 1:
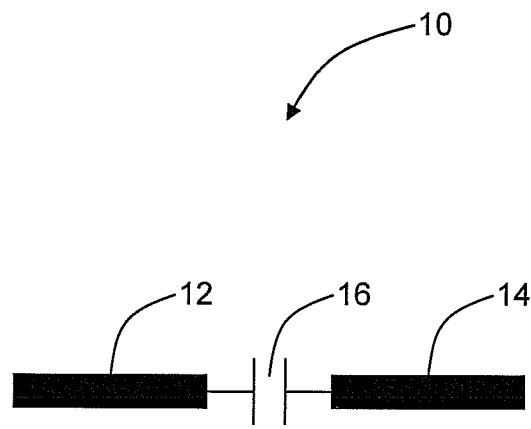
FIG. 1 shows an illustrative capacitive sensor or capacitive switch that can be used to detect a button being pushed.
Figure 2:
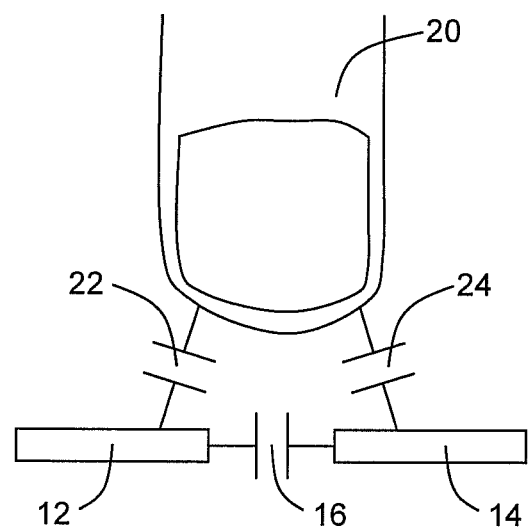
FIG. 2 shows the capacitive switch being pushed by a user.

The illustrative keypad 118 comprises at least one capacitive sensor or a capacitive switch as described above in FIG. 1 and FIG. 2. There are various capacitive sensor designs that may be present on a printed circuit board. For example, in one illustrative capacitive sensor an excitation square wave is applied to the source side of the illustrative sensor to set the electric field in the capacitive sensor, and the resulting stimulus creates an electric field in the sensor that partially protrudes through an overlay plastic. In another illustrative capacitive sensor, a constant current source is applied to one terminal, and the other terminal is grounded. Additional finger capacitance is added to the capacitive sensor when the user makes contact with the sensor that results in an increase in the RC-rise time during the charging cycle. Other such designs shall readily suggest themselves to those of ordinary skill in the art.

Additionally, the keypad 118 comprises a logic component 119. The logic component 119 is configured to determine a capacitive sensing range for each capacitive sensing switch. The logic component 119 provides an illustrative means for determining a capacitive sensing range for each capacitive sensing switch, wherein the capacitive sensing range corresponds to the charging and discharging of the capacitive sensing switch. The capacitive sensing range is the difference between the maximum capacitance and minimum capacitance. Several factors determine the amount of separation, namely, the sampling frequency, the amount of noise caused by EMI, the parasitic capacitance corresponding to the capacitive switch, the system resistance, and other such factors.

The logic component 119 is also configured to determine whether the capacitive sensing range exceeds a first initialization threshold. The logic component calculates or identifies a first initialization threshold that corresponds to the capacitive sensing range. The logic component 119 is configured to communicate that the capacitive sensing switch has been initialized after the first initialization threshold has been exceeded. By way of example and not of limitation, the minimum capacitance and maximum capacitance is measured by calculating the RC time constant. It shall be appreciated by those of ordinary skill in the art, that similar electrical variables can be measured that achieve the result of generating a minimum value and a maximum value for the capacitive sensing switch In the illustrative embodiment, the first initialization threshold associated with the capacitive sensing range may be a static initialization threshold value. In an alternative embodiment, the initialization threshold associated with the capacitive sensing range may be a dynamically generated initialization threshold. For example, the first initialization threshold value may be changed depending upon the button sampling algorithm that is used by the logic component 119.

The capacitive sensing switch is properly initialized when the capacitive sensing range exceeds the first initialization threshold. This initialization process occurs with sufficient frequency to compensate for the background EMI.

After the capacitive sensing switch has been properly initialized, the wireless device 100 then proceeds to determine whether the capacitive switch has been pushed. A means for detecting the button push may be performed by the keypad logic component 119, the processor 112, or any combination thereof.

For example, the logic component 119 obtains a measured capacitive value, and processor 112 determines whether the measured capacitive value exceeds a second push-button threshold. When the second push-button threshold has been exceeded the button push is detected. In another embodiment, the processor 112 may also be configured to measure the capacitive value and is configured to process computer instructions that detect a button push for each capacitive sensing switch when the measured capacitive value exceeds the second push-button threshold.

The illustrative processor 112 is then configured to process a computer instruction corresponding to the capacitive sensing switch after the capacitive sensing switch has been initialized and a pushed button has been detected. The computer instructions that are processed are specific to the key on the keypad.

Figure 4:
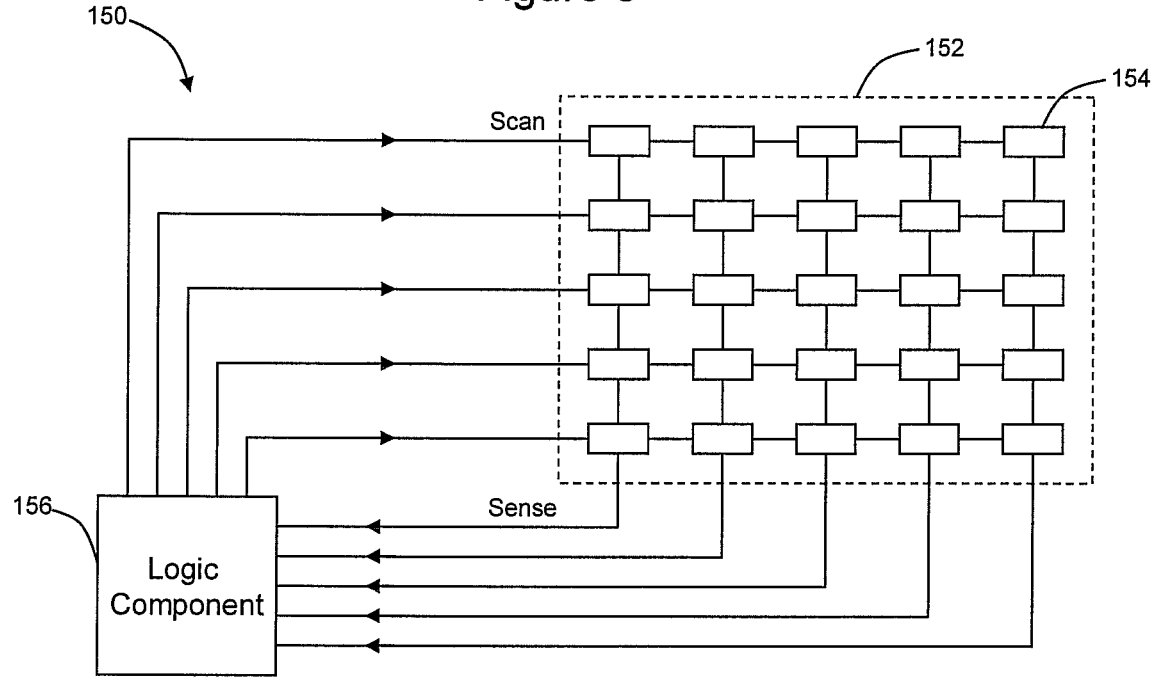
FIG. 4 shows a block diagram of a logic component that is operatively coupled to a capacitive switch array.

Referring to FIG. 4 there is shown a block diagram of a logic component 156 that is operatively coupled to a capacitive switch array 152. The capacitive switch array 152 comprises a plurality of capacitive switches 154 that act as buttons on a keypad. The logic component 156 is configured to, at a minimum, initialize the capacitive switch array 152.

The logic component 156 is used to scan the scan lines, i.e. generate the signals on the lines, interpret interrupts from the sense lines, set the MOSFETs on and off, and perform the initialization functions. Generally, the logic component 156 is specific to the device and its corresponding keypad. By way of example and not of limitation, the keypad of the present invention is used in a wireless device having a Qualcomm® chipset, and the scan lines and sense lines simply run to designated pins on the logic component 156. It shall be appreciated by those of ordinary skill in the art having the benefit of this disclosure that there are numerous circuits, component, and subcomponents that may be used for the logic component 156.

In the illustrative embodiment, the logic component 156 is a slave node and the master node is the illustrative processor 112 that uses the Inter-Integrated Circuit (I²C) protocol. In operation, the logic component 156 initializes the capacitive array 152. Until the capacitive array 152 is initialized, the master node embodied in the processor 112 does not spend processing time determining whether the second push-button threshold has been exceeded, or sending commands as would be appreciated by those of ordinary skill in the art. Thus, resources are conserved and battery life is extended for the wireless device 100.

Figure 5:
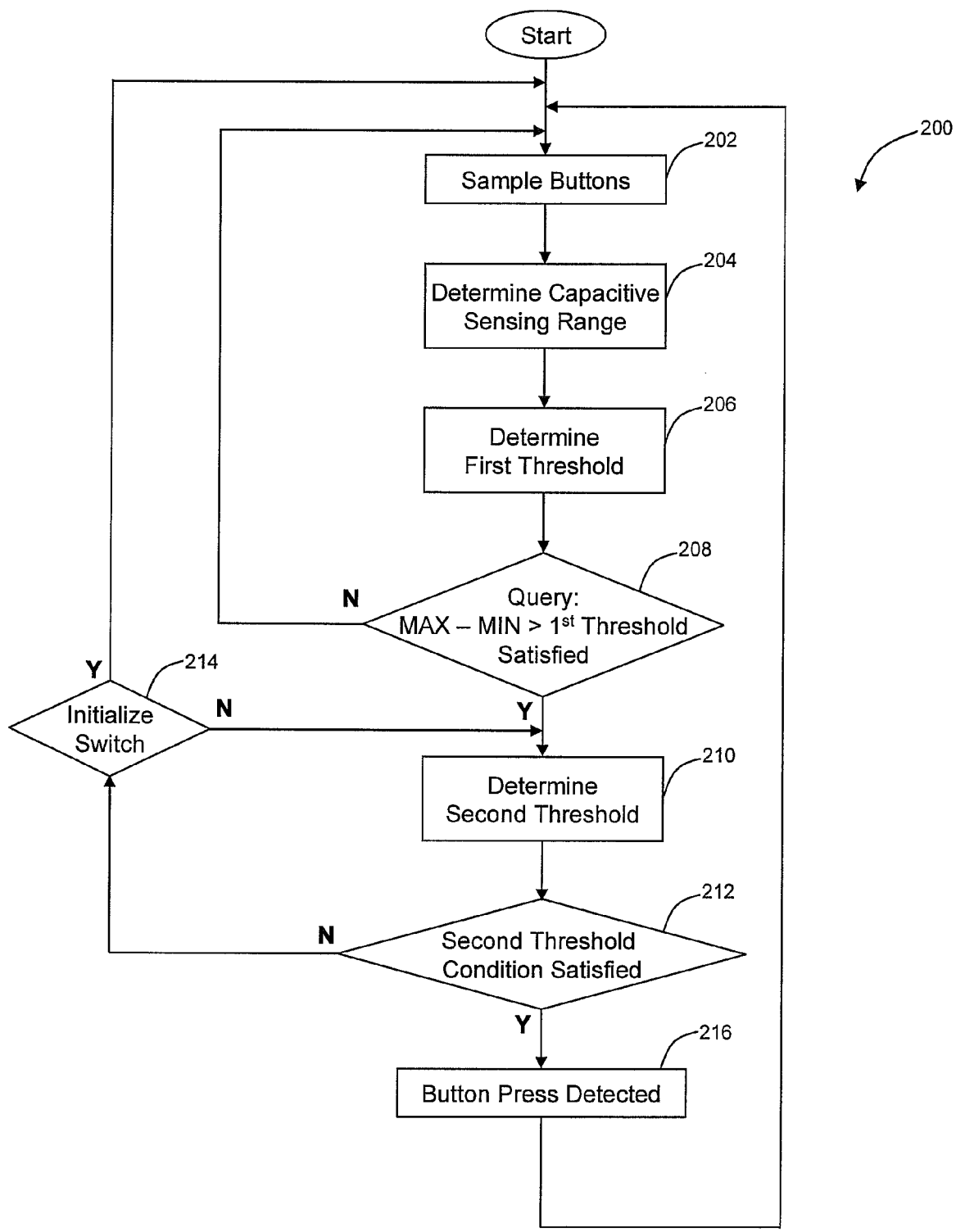
FIG. 5 shows an illustrative flowchart of a method for initializing a capacitive sensing switch for a wireless device and detecting a button push.

Referring to FIG. 5 there is shown an illustrative flowchart 200 of a method for initializing at least one capacitive sensing switch for a wireless device 100 and detecting a button push. The method is initiated at block 202 where the capacitive sensing switches are sampled, typically, with a predetermined frequency.

The method then proceeds to block 204 where the capacitive sensing switch is initialized by determining the capacitive sensing range for each capacitive sensing switch. The logic component 119 described above provides an illustrative means for determining the capacitive sensing range for each capacitive sensing switch, wherein the capacitive sensing range corresponds to the charging and discharging of the capacitive sensing switch. The capacitive sensing range is the difference between the maximum capacitance and minimum capacitance. Several factors determine the amount of separation, namely, the sampling frequency, the amount of noise caused by EMI, the parasitic capacitance corresponding to the capacitive switch, the system resistance, and other such factors. In the illustrative embodiment, the capacitive sensing range for at least one capacitive sensing switch or a capacitive switch array is associated with the keypad for the wireless device.

The method then proceeds to block 206 where a static first initialization threshold is called or identified. Alternatively, a dynamic first initialization threshold is calculated or determined. The first condition that must be satisfied is presented at decision diamond 208 where the first initialization threshold must be exceeded by the capacitive sensing range, in which the capacitive sensing range is the difference between the maximum capacitance and minimum capacitance. In the illustrative embodiment, the minimum capacitance and maximum capacitance is measured by calculating the RC time constant. It shall be appreciated by those of ordinary skill in the art, that similar electrical variables can be measured that achieve the result of generating a minimum value and a maximum value for the capacitive sensing switch.

If the first condition associated with decision diamond 208 is not satisfied, the method returns to block 202 where each capacitive switch is sampled. In the illustrative embodiment, this process of sampling buttons and determining if the first condition is being satisfied is performed by the logic component 119 or logic component 156.

However, if the first initialization threshold is exceeded by the capacitive sensing range, then the capacitive switch has been properly initialized and the method proceeds to block 210. In operation, the method comprises having the logic component 119 or logic component 156 communicate that the capacitive sensing switch has been initialized after the first condition has been satisfied.

The method then proceeds to determine whether a button has been pushed. However, if the first condition that initializes the capacitive switch has not been satisfied, the method does not proceed to determine whether a button has been pushed or determine the button functions. Only after the capacitive switch has been initialized, does the method proceed to determine whether a button has been pushed.

To detect a button push, the method establishes a second condition that comprises repeatedly measuring a capacitive value for the capacitive sensing switch and determining whether the measured capacitive value exceeds a push-button threshold. At block 210, a second push-button threshold is selected or determined. The second push-button threshold may be a static value or may be dynamically determined.

At decision diamond 212, the determination is made of whether a measured capacitive value exceeds the second push-button threshold. If the second push-button threshold condition has not been exceeded, the method proceeds to decision diamond 214, where the determination is made to re-initialize the capacitive switch. If the capacitive switch has been recently or properly initialized, then the method proceeds to block 210 and repeatedly attempts to satisfy the second "push-button" condition. However, if the capacitive switch has not been recently or property initialized, the method proceeds to block 202 where the buttons are sampled and each capacitive switch is newly initialized as described previously.

If the second push-button threshold has been exceeded by the measured capacitive value at decision diamond 212, the method proceeds to block 216 where a button press is detected. In one embodiment, the processor 112 is configured to detect a button push for each capacitive sensing switch. Alternatively, the logic component 119 may also make the determination of whether the measured capacitive value exceeds the second push-button threshold. Thus, a button press is detected for the capacitive sensing switch when the first condition and the second condition are both satisfied.

After detecting a button push, the illustrative method returns to block 202 and continues to sample the capacitive switch. Alternatively, the method may bypass testing the first condition that initializes each capacitive switch and may proceed directly to block 210 and attempt to test the second condition that detects another button push.

Figure 6:
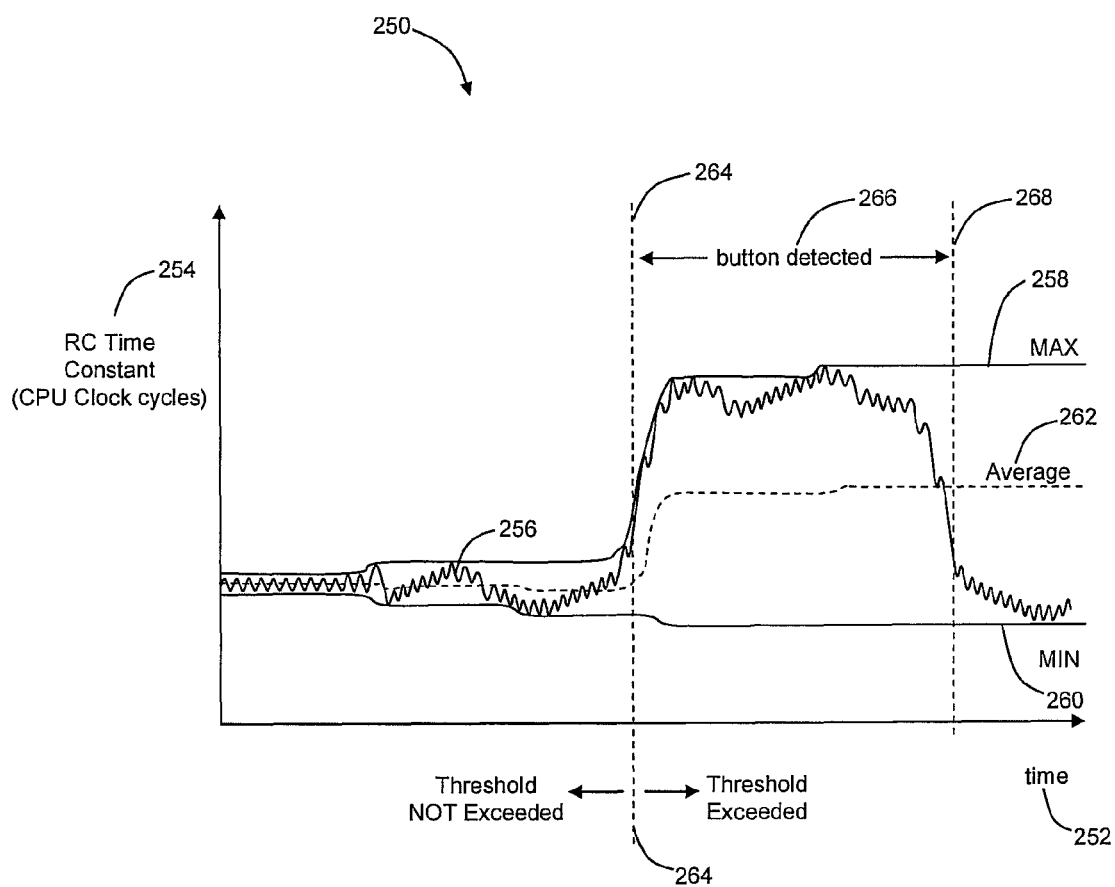
FIG. 6 shows an illustrative graph that depicts the capacitive switch initialization and button detection.

Referring to FIG. 6 there is shown an illustrative graph 250 that depicts initialization and button detection. The illustrative graph plots time 252 on the x-axis and the RC time constant 254 on the y-axis. It shall be appreciated by those skilled in the art that the RC time constant is measured in CPU clock cycles.

The waveform 256 provides a measured capacitive value for a capacitive sensing switch over an illustrative time period. During the initialization of the capacitive sensing switch, the capacitive sensing range must exceed a first initialization threshold. The capacitive sensing range is the difference between the maximum capacitance 258, the minimum capacitance 260. An average capacitance 262 is also shown. The capacitive switch is initialized when the capacitive sensing range exceeds the first initialization threshold at time 264. Additionally, at time 264, the second push-button threshold is also exceeded, so that a pushed button is detected. The pushed button is detected for a period 266, and then at time 268 the pushed button is not detected.

An apparatus, system and method that initialize a capacitive sensing switch on a wireless device have been described. As previously mentioned, there are two conditions that must be satisfied to detect a button push with the capacitive sensing switch. The first condition requires adequate separation in the measured capacitive range to initialize the capacitive sensing switch. Additionally, a second condition is required that measures a capacitive value that exceeds a second push-button threshold that corresponds to push button detection.

It is to be understood that the detailed description of illustrative embodiments are provided for illustrative purposes. The scope of the claims is not limited to these specific embodiments or examples. Therefore, various elements, details, execution of any methods, and uses can differ from those just described, or be expanded on or implemented using technologies not yet commercially viable, and yet still be within the inventive concepts of the present disclosure. The scope of the invention is determined by the following claims and their legal equivalents.

What is claimed is:

1. An apparatus for initializing a capacitive sensing switch and detecting a pushed button, the apparatus comprising:
   a keypad associated with a wireless device, wherein the keypad comprises a plurality of capacitive sensing switches;
   a logic component determines a capacitive sensing range for each capacitive sensing switch of the plurality of capacitive sensing switches, wherein the capacitive sensing range corresponds to a difference between a maximum capacitance and a minimum capacitance, wherein the minimum capacitance and the maximum capacitance are measured by calculating a RC time constant;
   an initialization threshold associated with the capacitive sensing range, wherein the logic component determines whether the capacitive sensing range exceeds the initialization threshold, wherein said each capacitive sensing switch is initialized when the capacitive sensing range exceeds the initialization threshold;
   a corresponding measured capacitive value that measures a corresponding capacitive value for said each capacitive sensing switch is associated with a corresponding push-button threshold that determines whether a corresponding button has been pushed; and
   a processor processes computer instructions that correspond to said each capacitive sensing switch when the capacitive sensing range exceeds the initialization threshold and when the corresponding measured capacitive value for said each capacitive sensing switch exceeds the corresponding push-button threshold.

2. The apparatus of claim 1, wherein the logic component communicates that the capacitive sensing switch has been initialized after the initialization threshold has been exceeded.

3. The apparatus of claim 2, wherein the processor processes a computer instruction corresponding to the capacitive sensing switch after the capacitive sensing switch has been initialized.

4. The apparatus of claim 3, wherein the initialization threshold associated with the capacitive sensing range further comprises a static initialization threshold value.

5. The apparatus of claim 3, wherein the initialization threshold associated with the capacitive sensing range further comprises a dynamic initialization threshold value.

6. A system for initializing a capacitive sensing switch and detecting a pushed button, the system comprising:
   a keypad associated with a wireless device, wherein the keypad comprises a plurality of capacitive sensing switches;
   a logic component determines a capacitive sensing range for each capacitive sensing switch of the plurality of capacitive sensing switches, wherein the capacitive sensing range corresponds to a difference between a maximum capacitance and a minimum capacitance, wherein the minimum capacitance and the maximum capacitance are measured by calculating a RC time constant;

an initialization threshold associated with the capacitive sensing range, wherein the logic component determines whether the capacitive sensing range exceeds the initialization threshold, wherein said each capacitive sensing switch is initialized when the capacitive sensing range exceeds the initialization threshold;

a corresponding measured capacitive value for said each capacitive sensing switch, wherein the corresponding measured capacitive value is associated with a corresponding push-button threshold that determines whether a corresponding button has been pushed; and a processor detects the corresponding button has been pushed when the corresponding measured capacitive value exceeds the corresponding push-button threshold.

7. The apparatus of claim 6, wherein the logic component communicates that the capacitive sensing switch has been initialized after the initialization threshold has been exceeded.

8. The apparatus of claim 7, wherein the processor processes a computer instruction corresponding to the capacitive sensing switch after the capacitive sensing switch has been initialized.

9. The apparatus of claim 8, wherein the initialization threshold associated with the capacitive sensing range further comprises a static initialization threshold value.

10. The apparatus of claim 8, wherein the initialization threshold associated with the capacitive sensing range further comprises a dynamic initialization threshold value.

11. A method for initializing a capacitive sensing switch and detecting a button press, the method comprising:

determining a capacitive sensing range for each capacitive sensing switch of a plurality of capacitive sensing switches associated with a keypad for a wireless device, wherein the capacitive sensing range is a difference between a maximum capacitance and a minimum capacitance corresponding to a charging and a discharging of said each capacitive sensing switch, wherein the minimum capacitance and the maximum capacitance are measured by calculating a RC time constant;

establishing a first condition that comprises determining whether the capacitive sensing range exceeds an initialization threshold and initializes said each capacitive sensing switch;

enabling a logic component to communicate that said each capacitive sensing switch has been initialized after the first condition has been satisfied;

establishing a second condition that comprises repeatedly measuring a corresponding capacitive value for said each capacitive sensing switch and determining whether the corresponding capacitive value exceeds a corresponding push-button threshold; and detecting a corresponding button press for the corresponding capacitive value when the first condition and the second condition have been satisfied.

12. The method of claim 11, further comprising enabling the logic component to process a computer instruction corresponding to the capacitive sensing switch after the capacitive sensing switch has been initialized.

13. The method of claim 12, wherein the initialization threshold associated with the capacitive sensing range further comprises a static initialization threshold value.

14. The method of claim 12, wherein the initialization threshold associated with the capacitive sensing range further comprises generating the initialization threshold dynamically.

* * * * *